United States Patent [19]
Viswanath et al.

[11] Patent Number: 6,151,322
[45] Date of Patent: Nov. 21, 2000

[54] MULTIPORT DATA SWITCH HAVING DATA FRAME VLAN TAGGING AND VLAN STRIPPING

[75] Inventors: Somnath Viswanath, Sunnyvale; Peter Ka-Fai Chow, San Jose, both of Calif.

[73] Assignee: Advanced Micro Devices, Inc., Sunnyvale, Calif.

[21] Appl. No.: 08/992,917

[22] Filed: Dec. 18, 1997

Related U.S. Application Data

[60] Provisional application No. 60/038,025, Feb. 14, 1997.

[51] Int. Cl.$^7$ .................................................. H04L 12/28
[52] U.S. Cl. ........................................... 370/395; 370/412
[58] Field of Search ..................................... 370/401, 407, 370/410, 422, 427, 432, 469, 395, 389, 229, 412, 468; 395/200.68

[56] References Cited

U.S. PATENT DOCUMENTS

| | | |
|---|---|---|
| 5,394,402 | 2/1995 | Ross . |
| 5,515,376 | 5/1996 | Murthy et al. . |
| 5,684,800 | 11/1997 | Dobbins et al. ........................ 370/401 |
| 5,828,846 | 10/1998 | Kirby et al. ....................... 395/200.68 |
| 5,862,338 | 1/1999 | Walker et al. ..................... 395/200.54 |
| 5,910,955 | 6/1999 | Nishimura et al. ..................... 370/401 |

Primary Examiner—Huy D. Vu
Assistant Examiner—Alexander Boakye

[57] ABSTRACT

An integrated multiport switch will determine whether packets received at designated VLAN ports are tagged packets. If so, the VLAN tag is stripped from the packet before further processing the incoming data at the media access controller of the port. The stripped tag is forwarded to a rules checker, which determines further routing of the packet to one or more destinations. The VLAN tag data, which may be modified by the rules checker, and the remainder of the packet data are stored separately in a memory external to the integrated switch. A control register contains designated VLAN types that can be compared with the VLAN type field in the tagged packet. The number of bytes of data received can thus be counted to locate the field of the VLAN packet assigned to VLAN type. VLAN tags may be readily inserted in untagged or stripped packets that are to be transmitted at a VLAN port. The VLAN tag data is then multiplexed with the remaining packet data obtained from a memory external to said chip and the multiplexed data is written to a single port RAM in a transmit FIFO at the MAC at the VLAN port designated for transmission. Buffering in the transmit FIFO permits continuous application of data to the FIFO.

7 Claims, 7 Drawing Sheets

ND DATA FRAME VLAN TAGGING AND VLAN STRIPPING

MULTIPORT DATA SWITCH HAVING DATA FRAME VLAN TAGGING AND VLAN STRIPPING

CROSS-REFERENCE TO RELATED APPLICATIONS

This application claims priority from provisional patent application Serial No. 60/038,025, filed Feb. 14, 1997, the entire disclosure of which is hereby incorporated by reference herein.

Some of the subject matter disclosed in this application is similar to subject matter disclosed in copending application Ser. No. 08/993,832, entitled MULTIPORT DATA SWITCH HAVING VARIABLE MAXIMUM PACKET LENGTH, filed Dec. 18, 1997.

TECHNICAL FIELD

The present invention relates to network switching and, more particularly, to data network switches capable of communicating data frames to both local area networks and virtual local area networks.

BACKGROUND ART

A multiport data network switch conventionally permits data communication among a plurality of media stations in a local area network. Each station in the network is associated with a port of the switch. Data frames, or packets, are transferred between stations by means of data network switch media access control (MAC) circuitry, or "engines," for each switch port. The network switch passes data frames received from a transmitting station to a destination station based on the header information in the received data frame.

The switch can link the network to other networks through one or more predesignated switch ports. The capability thus exists for creating logical workgroups of users who may be physically separated from each other. Members of a workgroup may be coupled directly with the switch in the local area network, while other members of the workgroup may be coupled to one or more remote networks that are linked to the switch at a designated port. These groupings can be thought of as virtual local area networks (VLANs) or "sub-networks" within a larger network. VLAN groupings can provide privacy and security to their members while enabling "broadcast domains" whereby broadcast traffic is kept "inside" the VLAN.

Data packets communicating within the VLAN require information that identifies the VLAN grouping, or VLAN type, and VLAN ID assigned to the station. Such information, or "tag," is provided as additional fields in the frame header. The frame format for such packets thus is expanded relative to the standard frame format. For example, the Ethernet ANSI/IEEE 802.3 standard untagged frame format and 802.1d standard tagged frame format are illustrated, respectively, in FIGS. 1(a) and 1(b).

The untagged frame format, shown in FIG. 1(a), includes a header portion that allocates six bytes for destination address, six bytes for source address, and two bytes for type/length. The data portion is not fixed in length, but is within a permissible range between forty six and fifteen hundred bytes. A four byte frame check sequence (FCS) follows the data portion. Under Ethernet protocol, the maximum packet length for untagged packets is 1518 bytes. The recently adopted tagged frame format, shown in FIG. 1(b), provides for a 2 byte VLAN Type field and a 2 byte VLAN ID field positioned between the source address field and the type/length field. The frame format for VLAN tagged frames thus is extended in length with respect to the untagged frames. The maximum packet length for such tagged packets is 1522 bytes. The above-identified related copending application describes, in more detail, application of the maximum packet length criterion to received packets.

These multiple header format standards impose challenges in the management of data communication by the switch. In addition to its various routing functions that are based on header information, the switch must monitor whether packets are within maximum permissible lengths. Determination of whether a given packet, which is of a length between 1518 bytes and 1522 bytes, is within the permissible maximum byte length requires recognition of whether or not the frame is a tagged frame. Inasmuch as this information is located in header fields that only exist in tagged frames, a technique must be found to distinguish the third header field of each frame as either a type/length field or a VLAN type field. As a further complication, tagged frames are only permissible for designated VLAN ports, i.e., "tagged ports." A frame of 1522 bytes length may be oversized even though tagged, if it has been received at a port not designated for VLAN communication. Thus, permissible length determination also must account for port authorization. Conversely, a frame communicated via a tagged port may or may not be a tagged frame. A frame of 1522 bytes length that has been received at a tagged port thus would be oversized if it is not a tagged frame. Recognition of a frame as a tagged frame by the switch is also required for routing purposes. The switch, however, has no indication that an incoming frame is tagged prior to receiving the VLAN type field with the frame.

Moreover, other switch functionalities, and conformance with external network interaction, will often require conversion of a tagged frame to untagged format. For example, a tagged packet, received at a VLAN tagged port, may require transmission to a network station coupled to an untagged port. Also, if the VLAN header information is no longer otherwise necessary, continued storage of such data becomes inefficient from the standpoint of memory capacity and transmission bandwidth. The switch must be capable of stripping the tag information from the frame header at appropriate stages of operation. The switch must also be capable of reconverting a stripped frame to tagged format if the packet is to be transmitted to a VLAN destination via a tagged port.

DISCLOSURE OF THE INVENTION

The present invention addresses the above noted needs and drawbacks of current network switches in part by providing an integrated multiport switch that will determine whether packets received at designated VLAN ports are tagged packets. If so, the VLAN tag is stripped from the packet before further processing the incoming data at the media access controller of the port. The stripped tag is forwarded to a rules checker in the switch, which determines further routing of the packet to one or more destinations. Transmission to the VLAN network via a designated VLAN port may be required. The VLAN tag data, which may be modified by the rules checker, and the remainder of the packet data are stored separately in a memory external to the integrated switch.

A further advantage of the invention is that a control register is provided that contains designated VLAN types that can be compared with the VLAN type field in the tagged packet. The number of bytes of data received can thus be counted to locate the field of the VLAN packet assigned to VLAN type. Determination thus easily is made dependent upon whether a data match exists.

A further advantage of the present invention is that VLAN tags may be readily inserted in untagged or stripped packets that are to be transmitted at a VLAN port. VLAN tag data related to a packet is dequeued by an internal rules checker in the switch. The VLAN tag data is then multiplexed with the remaining packet data obtained from a memory external to said chip and the multiplexed data is written to a memory in a transmit FIFO at the MAC at the VLAN port designated for transmission. The RAM preferably is a single port RAM, with buffering provided in the transmit FIFO to conserve chip architecture and bandwidth resources.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein:

FIGS. 3a–3c represent a block diagram of a multiport switch used in the packet switched system of FIG. 2.

BEST MODE FOR CARRYING OUT THE INVENTION

Figure 2:
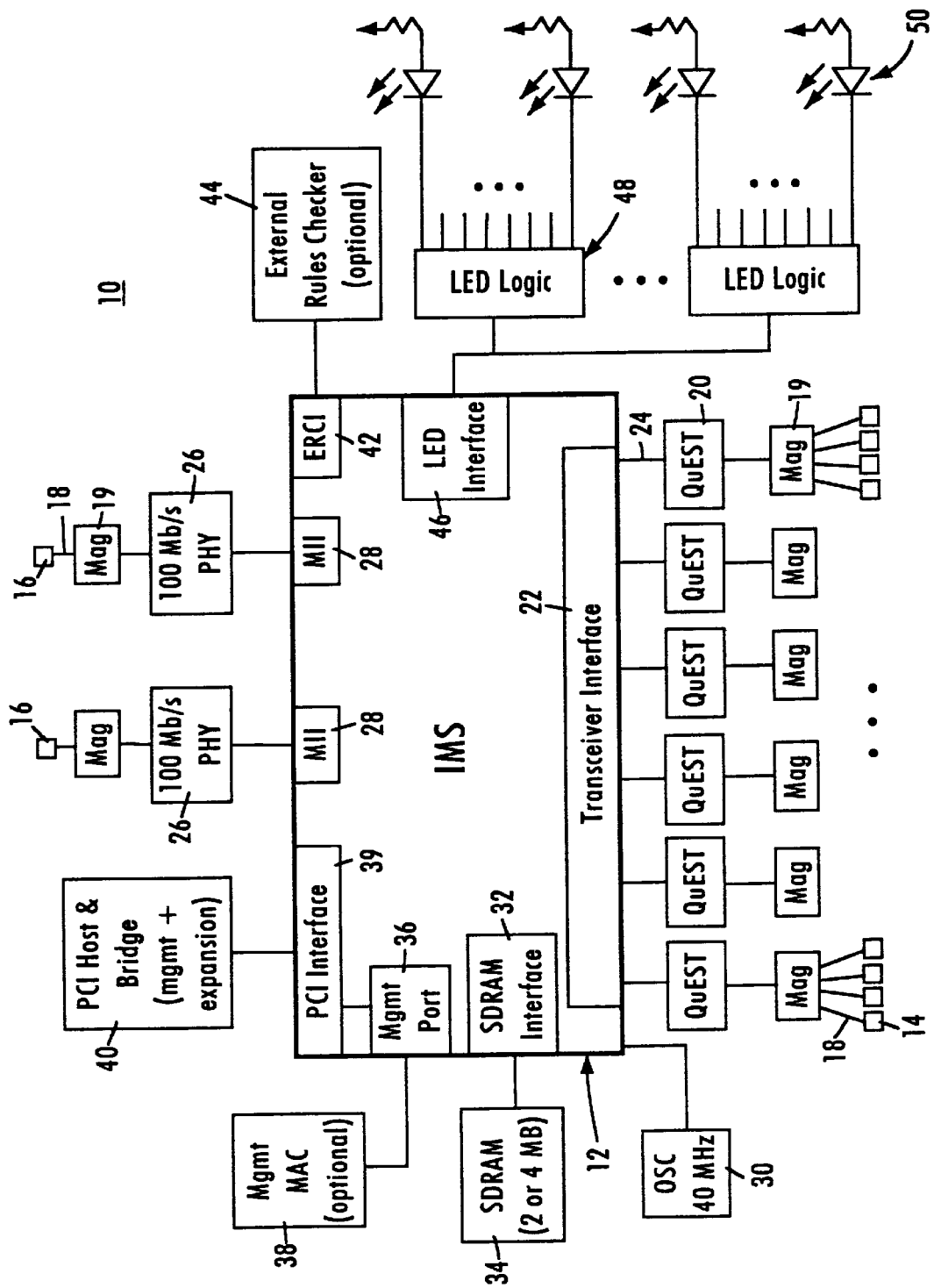
FIG. 2 is a block diagram of a packet switched system in accordance with an embodiment of the present invention.

The present invention is exemplified herein in a packet switched network environment, such as an Ethernet (IEEE 802.3) network. From the following detailed description it should be apparent that the present invention, illustrated as system 10 in the block diagram of FIG. 2, is also applicable to other packet switched systems. The packet switched network includes an integrated multiport switch (IMS) 12 that enables communication of data packets between network stations. The network stations may have different configurations. In the current example, twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 may include an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 2, the network 10 includes a series of switch transceivers 20, labelled QuEST, that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, as described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 Mhz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices.

The multiport switch 12 includes an internal decision making engine that selectively transmits data packets received from one source to at least one destination station. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 3B:
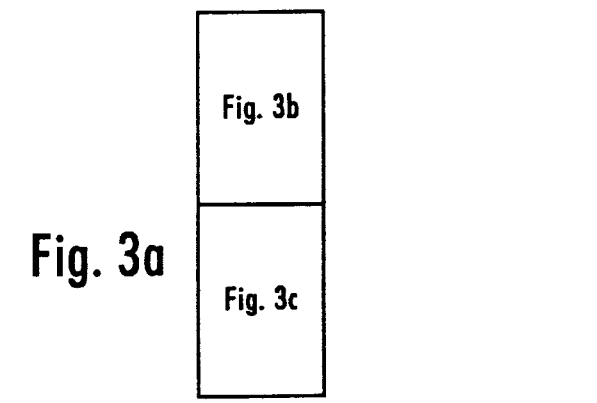
Figure 3B:
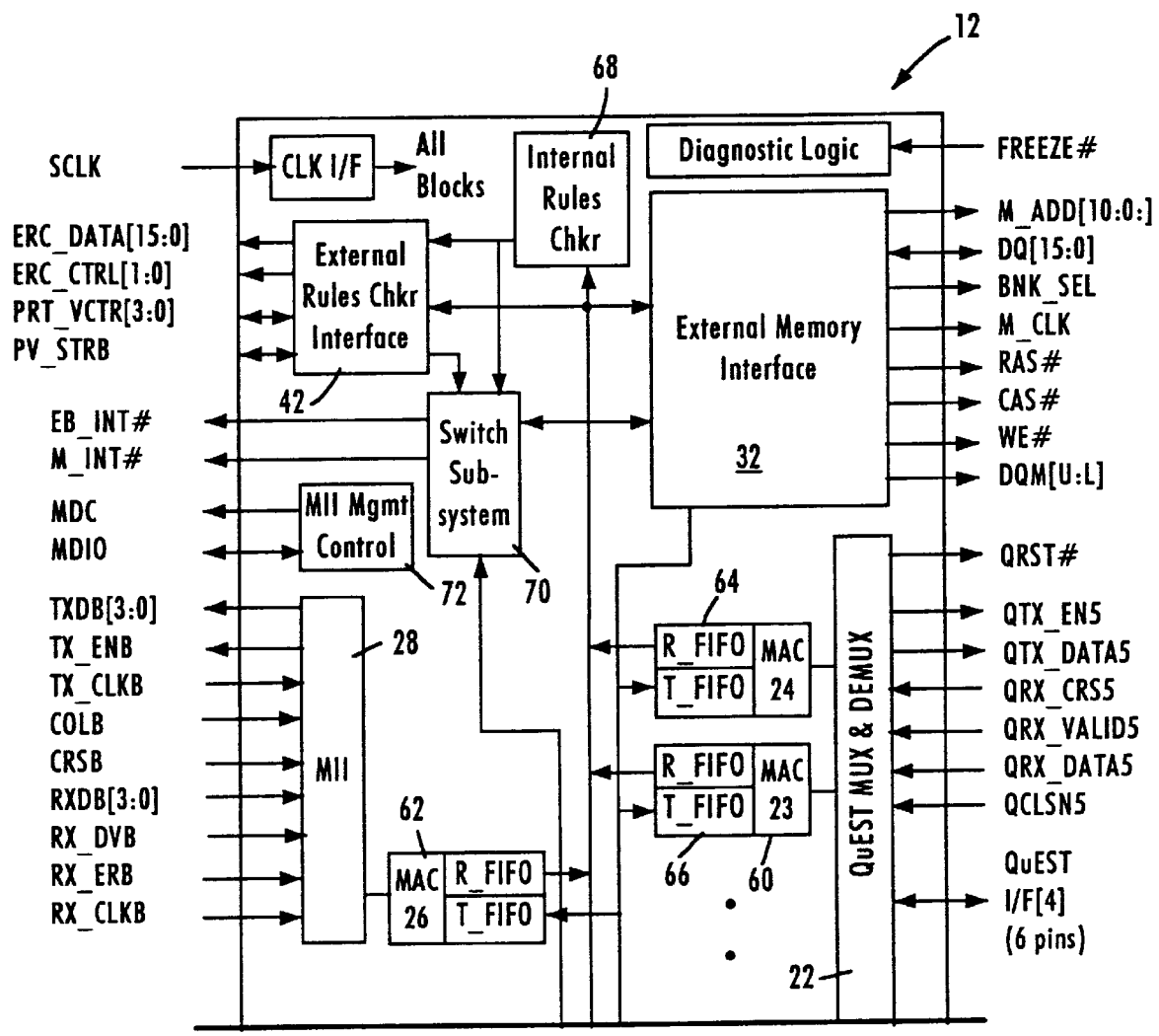
Figure 3C:
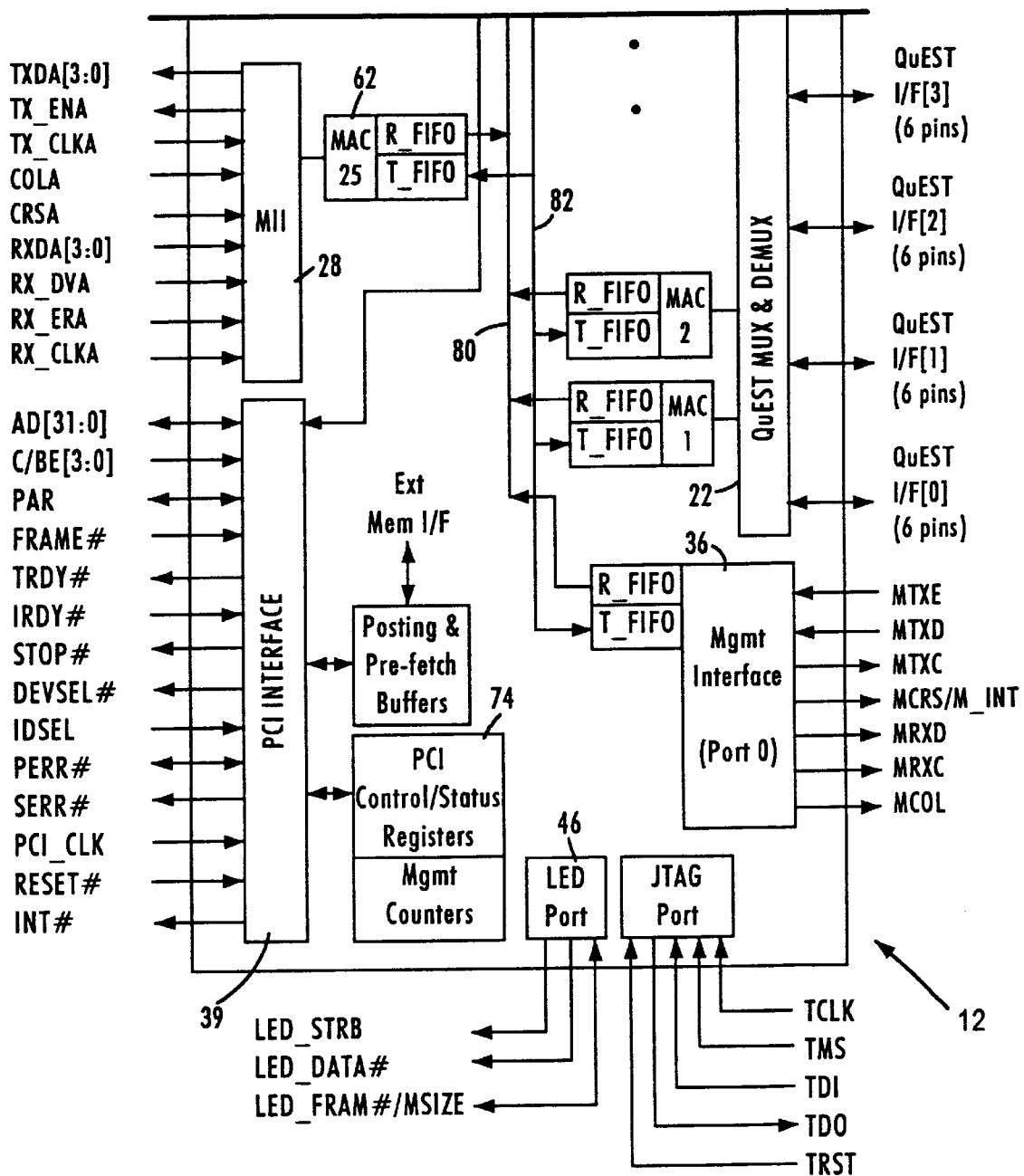

FIGS. 3a–3c comprise a more detailed block diagram example of the multiport switch 12 shown in FIG. 2. As shown in FIG. 3a, the upper and lower half of the block diagram are represented respectively by FIGS. 3b and 3c. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO buffer 66. Data packets from a network station are received by the corresponding MAC port and stored in the corresponding receive FIFO buffer 64. The received data packet is output from the corresponding receive FIFO buffer 64 to the external memory interface 32 for storage in the external memory 34.

The header of the received packet is also forwarded to a decision making engine, comprising an internal rules checker 68 and an external rules checker interface 32, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

Figure 1A:
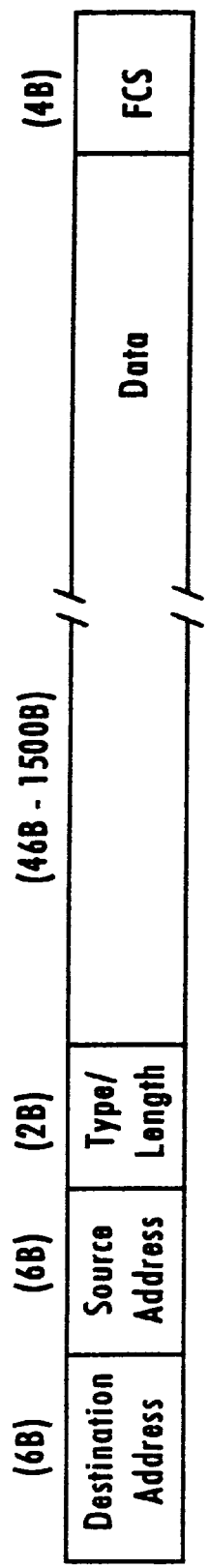
FIG. 1(a) and FIG. 1(b) are diagrams, respectively, of untagged and tagged frame formats as provided by the Ethernet Standard.
Figure 1B:
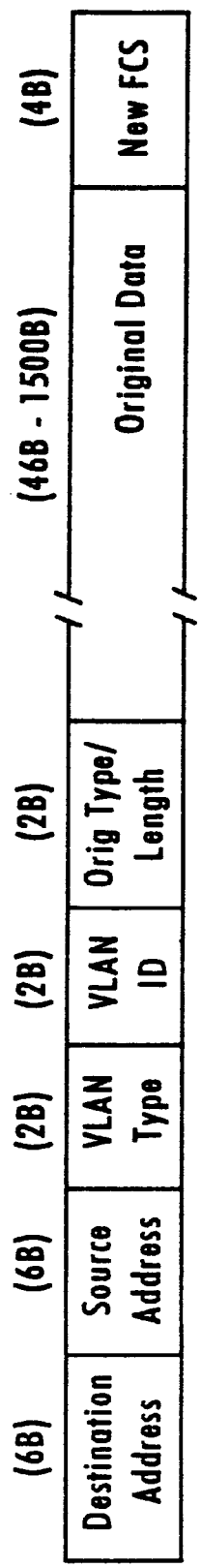

The internal rules checker 68 and external rules checker 44 provide the decision making logic for determining the destination MAC port for a given data packet. The decision making engine may indicate that a given data packet is to be output to either a single port, multiple ports, or all ports (i.e., broadcast). Each data packet includes a header, as described above with respect to FIGS. 1(a) and 1(b), having source and destination address, in accordance with which the decision making engine can identify the appropriate output MAC port(s). The destination address may correspond to a virtual address, in which case the decision making engine identifies output ports for a plurality of network stations. A received data packet may include a VLAN (virtual LAN) tagged frame according to IEEE 802.1d protocol that may specify another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface 72 also outputs a management data clock (MDC) providing a timing reference on the bidirectional management data IO (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

The IMS allows VLAN tagged frames on certain ports. The Host 40 is responsible for programming the 16-bit VLAN identifiers of the permissible VLANs in a VLAN Index Table Register, which preferably is located in the internal rules checker. VLANs may be either "port based" or "MAC based." Upon power-up, the Host assigns a VLAN Index to each port by programming a VLAN Port Index Table. The internal rules checker uses these port-based VLAN index values as a VLAN default. During runtime, as frames are received and addresses are learned, the Host can update a particular address with a new VLAN identifier in the internal rules checker address table control register to reflect a MAC-based VLAN association. In the preferred illustrated example of FIGS. 2 and 3, only the 100 Mb/s ports preferably may be tagged ports. However, any of the other ports may be designated for VLAN association and may be changed to full-duplex operation. If a port is untagged, frames received from this port are not checked for VLAN tags and frames transmitted to this port do not have VLAN tags inserted. If a port is tagged, frames received from this port are checked for VLAN tags.

Figure 4:
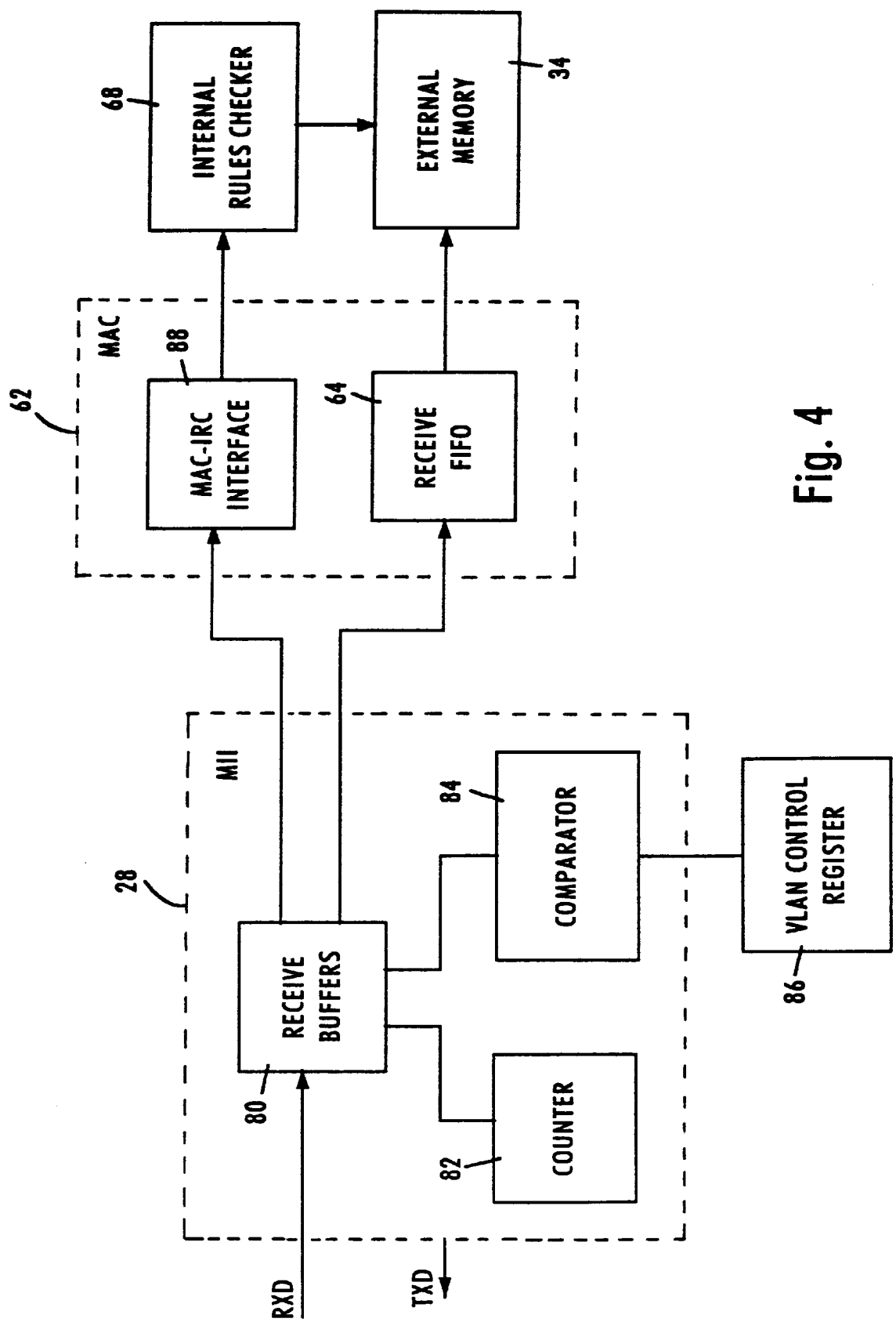
FIG. 4 is a block diagram of the switch elements that are implemented upon receipt of a frame at a tagged port in accordance with the invention.

When a switch port receives a frame from a tagged port, it may or may not contain a VLAN tag. If a VLAN tag is found, the tag is extracted and the VLAN identifier is stored with the frame in external memory. FIG. 4 is a block diagram of the switch elements that are implemented upon receipt of a frame at a tagged port in accordance with the invention. Frame data is received sequentially at buffers 80 at the MII 28. Counter 82, coupled to the receive buffers, counts each byte of incoming data. After the first twelve received bytes of the received frame, which represents the destination address field and source address field, the counter activates a signal to comparator 84. The succeeding two bytes of data are compared with the stored VLAN types in the Ethernet type control register 86. This register, which is preferably located in the internal rules checker 68, contains designated VLAN types. If a match is found, a tagged frame is indicated by the comparator. The VLAN type and VLAN ID data in the frame is stripped and diverted to the internal rules checker via MAC-Internal Rules Checker Interface 88. The rules checker determines, from VLAN information and other header information, from which output port(s) the frame subsequently is to be transmitted. The stripped VLAN tag data, which may be modified if appropriate by the internal rules checker, is written to the buffer header of the first buffer in external memory used to store the frame's data. If a tagged port's received frame contains a VLAN type that does not match the VLAN Ethertype register, the frame is assumed to be untagged. All frame data other than the tag data are written from the receive buffers in the MII to the receive FIFO 64 in the MAC 62. This data now corresponds in format to the standard untagged frame format of FIG. 1(a), to be written to the external memory 34.

Figure 5:
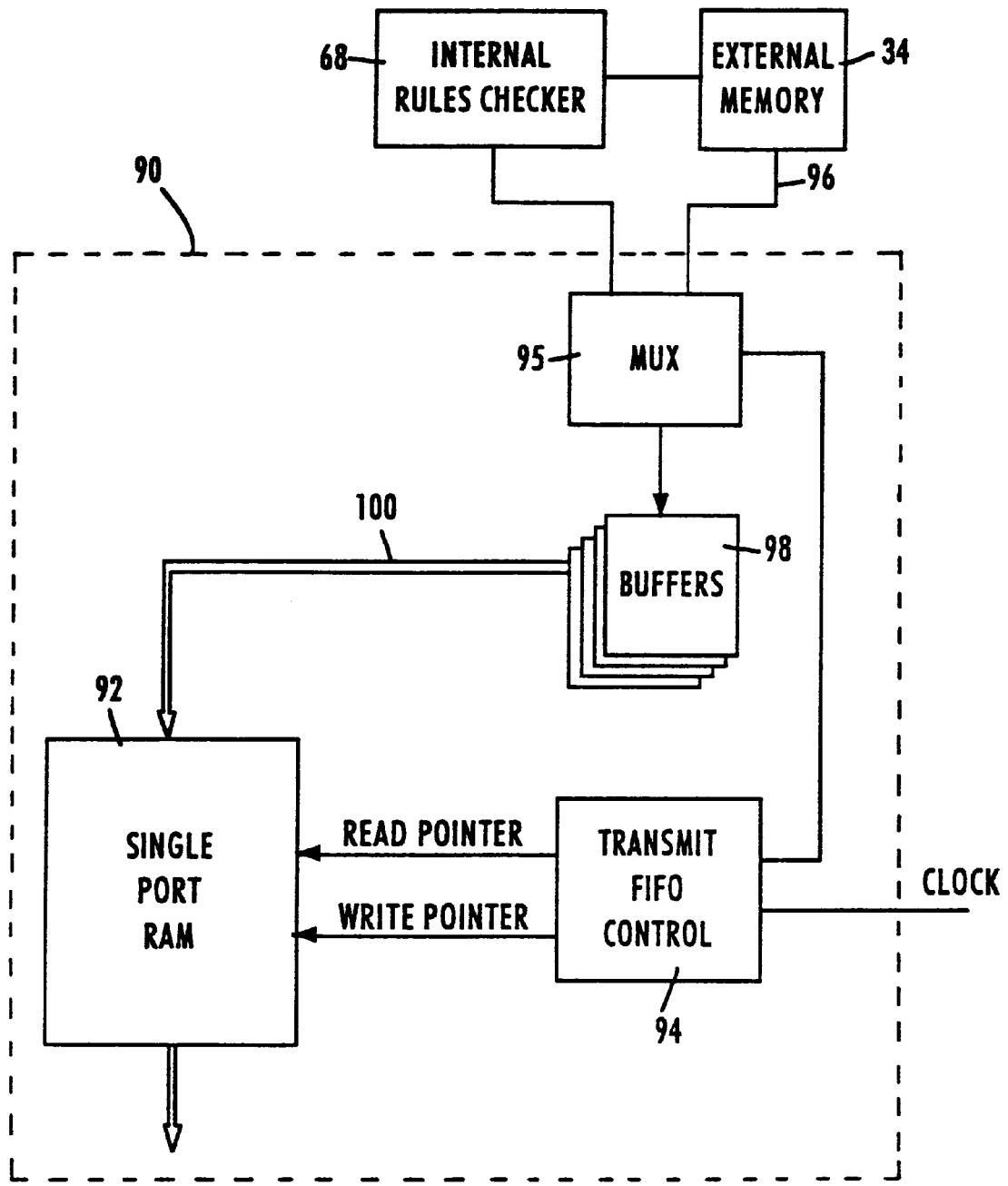
FIG. 5 is a block diagram of the elements that implement this operation in accordance with the present invention.

Frames transmitted from external memory to a tagged output port for communication to one or more VLAN destination stations have VLAN tags inserted, unless the tagging is selectively overridden by the rules checker. FIG. 5 is a block diagram of the elements that implement this operation in accordance with the present invention. The transmit FIFO at a tagged port comprises elements shown within the broken line block 90. A single port RAM 92 stores frame data received from the external memory. Under control of transmit FIFO control unit 94, the memory operation is changed from read to write and vice versa in successive clock cycles of an applied clock signal source. The control unit is coupled to the RAM by read pointer and write pointer lines. Multiplexer 95 receives, at a first input, the untagged frame format data directly from external memory 34 over a sixteen bit bus 96. VLAN tag data, i.e., VLAN type and VLAN ID, to be inserted in the frame is received from the external memory via a dequeuing block in the internal rules checker 68. Data is fed during each clock cycle from the multiplexer to one of four buffers 98 in the transmit FIFO. Data is written to the single port RAM via thirty two bit input bus 100. Data is read out of the single port RAM in 8 bit increments for transmission from the port to the network.

Figure 6:
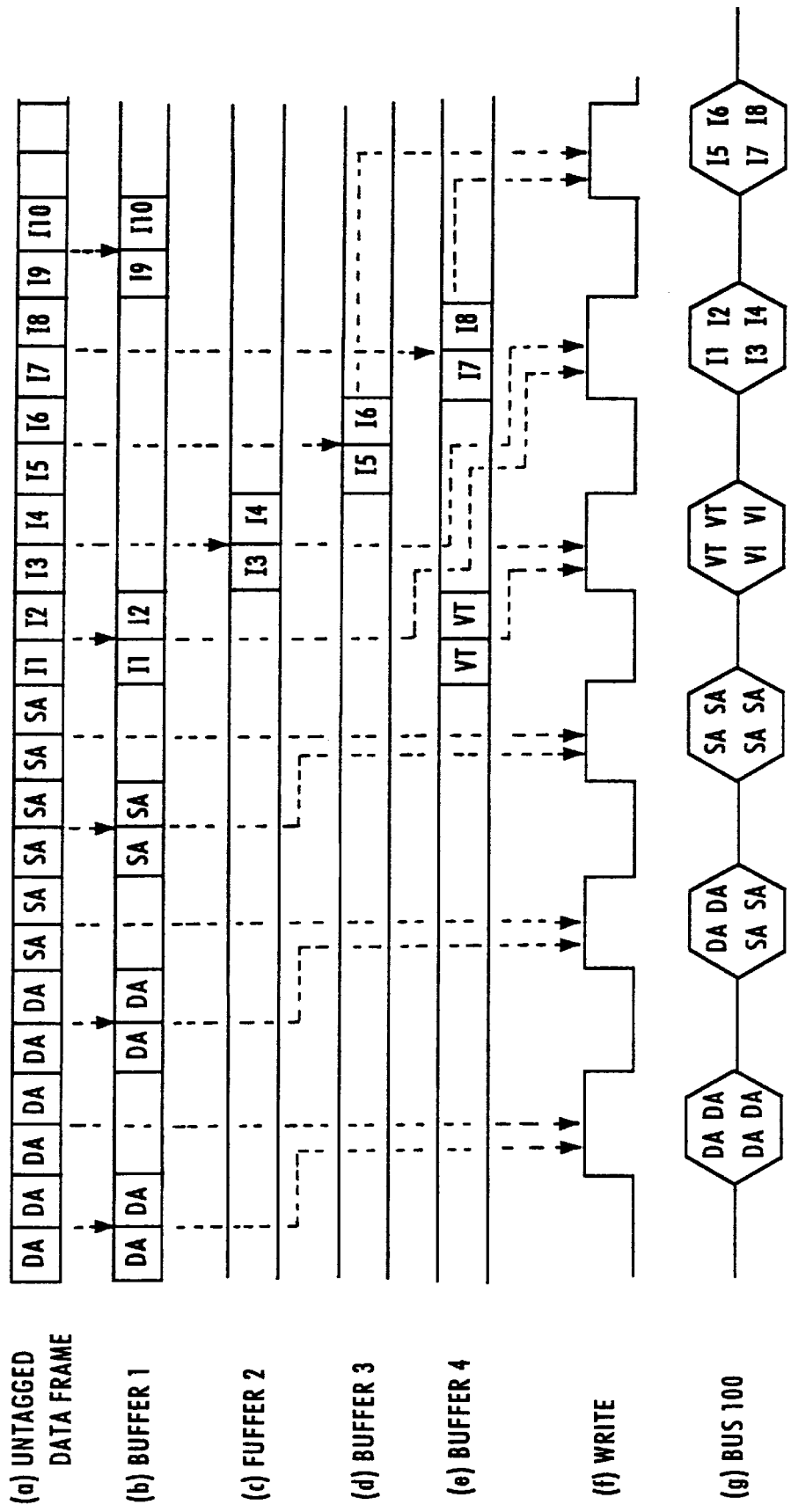
FIG. 6 is a timing chart illustrative of the tag insertion data transmission operation of the arrangement of FIG. 5.

FIG. 6 is a timing chart illustrative of the tag insertion data transmission operation of the arrangement of FIG. 5. The untagged frame data applied from the external memory to the multiplexer of the transmit FIFO is represented by individual byte identifiers in line (a) of the figure. For ease of explanation, header data for the address fields are specifically identified, the remainder of the data being indicated as an information, or I, field. Data is fed continuously in two byte increments in each clock cycle via sixteen bit bus 96. This data, along with the tag insertion data, is to be written into single port RAM 92. The two buffers, the activities of which are represented by lines (b) and (c) provide for the continuous transfer into the FIFO even in those alternate clock cycles in which the single port RAM is in a read out mode of operation. Line (f) of the figure is a write enable waveform wherein the high level represents the clock cycles in which the write operation takes place. Line (g) is a waveform that identifies the data transferred to the RAM during the write operation cycles. The dotted line vectors indicate the direction of data transfer during each respective clock cycle.

As shown in FIG. 6, the initial transfer occurs during a read cycle. Two bytes of destination address (DA) header data are transferred to buffer 1. In the next cycle, this data is transferred from buffer 1 via bus 100 to the RAM. As bus 100 can accommodate four bytes of data, the next two DA bytes of the frame are transferred without buffering also during this cycle. Operation continues in this manner for the DA and SA fields. Two bytes of data is transferred in buffer 1 during the read cycles and transferred to the RAM with the next incoming two bytes of data during the write cycles.

Upon transfer from the external memory of the twelve bytes of DA and SA data, control unit 94 enables the multiplexer to receive VLAN type (VT) and VLAN ID (VI) data. During the next read cycle, therefore, I1 and I2 data bytes are buffered in buffer 1. In the succeeding write cycle, the 2 bytes of VT data and the two bytes of VI data are transferred to RAM, thereby inserting the VLAN tag at the appropriate frame format relation. Also during this cycle, I3 and I4 data are buffered in buffer 2. No additional VLAN data is received for this frame. At this time, buffer 1 is holding I1 and I2 data, buffer 2 is holding I3 and I4 data. In the next cycle, a write cycle, four bytes of data I1–I4 are transferred from their respective buffers to the RAM. As no more than two buffers will be necessary for continuous transfer of data from the external memory, no transfer FIFO overflow is likely to occur. During the read cycles, of course, data is transferred out from the RAM for transmission to the network.

The invention thus provides the advantages of efficiently managing VLAN operation. Recognition of VLAN tagged frames and the stripping and insertion of VLAN tags provide maximum use of memory and bandwidth resources. Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein. For example, the bus transfer capacities may be changed with corresponding changes made to the number or capacities of transfer FIFO buffers.

We claim:

1. In an integrated multiport network switch comprising an integrated chip having a plurality of ports for transmitting data packets to and receiving data packets from a data network, each port having associated therewith a media access controller (MAC), at least one of said ports being designated a VLAN port for virtual local area network (VLAN) operation, a method for processing received packets comprising the steps of:

receiving a data packet at said VLAN port;

determining whether the received data packet is a VLAN tagged packet;

striping the VLAN tag from said packet in response to a positive VLAN tagged packet determination in said determining step;

forwarding the stripped VLAN tag to a rules checker in the switch; and applying the remainder of the stripped packet data to a receive first-in-first-out (FIFO) buffer at the MAC of said VLAN port;

wherein said determining step comprises the steps of:
counting the number of bytes of data of a packet received at said VLAN port; and
comparing the received data after a predetermined number of counted bytes with data stored in a control register.

2. A method as recited in claim 1, further comprising the steps of:
separately storing the VLAN tag data and the remainder of the stripped packet data in a memory external to said chip.

3. A method as recited in claim 2, wherein said VLAN tag data comprises VLAN type information and VLAN identification information and said comparing step comprises matching the VLAN type data field of the packet against predesignated VLAN types stored in said control register.

4. A method for administering data packet communication in an integrated multiport network switch having a plurality of ports for transmitting data packets to and receiving data packets from a data network, each port having associated therewith a media access controller (MAC), at least one of said ports being designated a VLAN port for virtual local area network (VLAN) operation, said method comprising the steps of:

determining whether a data packet received at a designated VLAN port is a VLAN tagged packet;

stripping the VLAN tag from said packet in response to a positive VLAN tagged packet determination in said determining step;

forwarding the stripped VLAN tag to a rules checker in the switch;

separately storing the VLAN tag data and the remainder of the stripped packet data in untagged format in a memory external to said chip;

determining whether said packet is to be transmitted as a VLAN packet at a designated VLAN port;

in response to a positive VLAN transmission determination, combining said VLAN tag data and remainder data to obtain a packet in VLAN tagged format;

wherein said combining step comprises the steps of:
dequeuing said VLAN tag data;
multiplexing said VLAN tag data with packet data from said external memory; and
writing the multiplexed data to a memory in a transmit FIFO at the MAC at the VLAN port designated for transmission.

5. A method as recited in claim 4, wherein the memory in said transmit FIFO is a single port random access memory (RAM) that alternately transfers between read and write operation states in successive clock cycles, and said writing step comprises the steps of:

feeding packet data to the transmit FIFO in successive clock cycles;

buffering data received by said FIFO during clock cycles in which said single port RAM is in a read operation state; and applying said buffered data and data received by said FIFO to said single port RAM during clock cycles in which said single port RAM is in a write operation state.

6. In an integrated multiport network switch comprising an integrated chip having a plurality of ports for transmitting data packets to and receiving data packets from a data network, each port having associated therewith a media access controller (MAC), at least one of said ports being designated a VLAN port for virtual local area network (VLAN) operation, a method for processing a packet to be transmitted to one or more VLAN destinations from a designated VLAN port, comprising the steps of:

dequeuing VLAN tag data related to said packet;

multiplexing said VLAN tag data with packet data obtained from a memory external to said chip; and writing the multiplexed data to a memory in a transmit FIFO at the MAC at the VLAN port designated for transmission;

wherein the memory in said transmit FIFO is a single port random access memory (RAM) that alternately transfers between read and write operation states in successive clock cycles, and said writing step comprises the steps of:

feeding packet data to the transmit FIFO in successive clock cycles;

buffering data received by said FIFO during clock cycles in which said single port RAM is in a read operation state; and applying said buffered data and data received by said FIFO to said single port RAM during clock cycles in which said single port RAM is in a write operation state.

7. A method as recited in claim 6, wherein said VLAN tag data comprises VLAN type information and VLAN identification information and said multiplex step comprises inserting said VLAN tag data in prescribed header field locations of the packet, whereby said packet complies with standard VLAN tag frame format predesignated VLAN types stored in said control register.

* * * * *